United States Patent
Yamazaki

(10) Patent No.: US 9,209,310 B2
(45) Date of Patent: Dec. 8, 2015

(54) SEMICONDUCTOR DEVICE AND METHOD FOR MANUFACTURING THE SEMICONDUCTOR DEVICE

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 410 days.

(21) Appl. No.: 12/899,276

(22) Filed: Oct. 6, 2010

(65) Prior Publication Data
US 2011/0084270 A1    Apr. 14, 2011

(30) Foreign Application Priority Data
Oct. 9, 2009 (JP) .................. 2009-235740

(51) Int. Cl.
*G02F 1/136*    (2006.01)
*G09G 3/36*    (2006.01)
*H01L 29/04*    (2006.01)
*H01L 29/786*    (2006.01)

(52) U.S. Cl.
CPC ................. *H01L 29/7869* (2013.01)

(58) Field of Classification Search
USPC ....................................... 349/42–43
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,323,521 B1 * | 11/2001 | Seo | 257/347 |
| 6,563,174 B2 | 5/2003 | Kawasaki et al. | |
| 6,727,522 B1 | 4/2004 | Kawasaki et al. | |
| 6,894,311 B2 * | 5/2005 | Maeda et al. | 257/66 |
| 6,969,889 B2 * | 11/2005 | Cho et al. | 257/347 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

| EP | 1 737 044 A1 | 12/2006 |
|---|---|---|
| EP | 2219225 A | 8/2010 |

(Continued)

OTHER PUBLICATIONS

Na et al., "High field-effect mobility amorphous InGaZnO transistors with aluminum electrodes", Applied Physics Letters 93, 063501 (2008).*

(Continued)

*Primary Examiner* — Hoan C Nguyen
(74) *Attorney, Agent, or Firm* — Fish & Richardson P.C.

(57) ABSTRACT

An object is to provide a thin film transistor including an oxide semiconductor layer, in which a material used for the oxide semiconductor layer and a material used for source and drain electrode layers are prevented from reacting with each other. The source and drain electrode layers provided over a substrate having an insulating surface have a stacked structure of two or more layers. In the stack of layers, a layer which is in contact with an oxide semiconductor layer is a metal layer including a metal element other than a metal element included in the oxide semiconductor layer. An element selected from Sn, Sb, Se, Te, Pd, Ag, Ni, and Cu; an alloy containing any of these elements as a component; an alloy containing any of these elements in combination; or the like is used for a material of the metal layer used.

13 Claims, 10 Drawing Sheets

(56) References Cited

U.S. PATENT DOCUMENTS

| | | |
|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,855,379 B2 | 12/2010 | Hayashi et al. |
| 7,906,777 B2 | 3/2011 | Yano et al. |
| 8,088,652 B2 | 1/2012 | Hayashi et al. |
| 8,237,166 B2 | 8/2012 | Kumomi et al. |
| 8,373,164 B2 | 2/2013 | Yamazaki |
| 8,436,349 B2 | 5/2013 | Sano et al. |
| 8,502,217 B2 | 8/2013 | Sato et al. |
| 8,786,793 B2 | 7/2014 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0012017 A1* | 1/2004 | Nagayama ............ 257/40 |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199879 A1* | 9/2005 | Hoffman et al. ............ 257/72 |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0241327 A1 | 10/2007 | Kim et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Covan et al. |
| 2008/0191213 A1* | 8/2008 | Bae et al. ............ 257/66 |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0315026 A1* | 12/2009 | Jeong et al. ............ 257/43 |
| 2010/0025676 A1* | 2/2010 | Yamazaki et al. ............ 257/43 |
| 2010/0044701 A1 | 2/2010 | Sano et al. |
| 2010/0065838 A1 | 3/2010 | Yamazaki et al. |
| 2010/0065840 A1 | 3/2010 | Yamazaki et al. |
| 2010/0065844 A1 | 3/2010 | Tokunaga |
| 2010/0072469 A1 | 3/2010 | Yamazaki et al. |
| 2010/0092800 A1 | 4/2010 | Itagaki et al. |
| 2010/0109002 A1 | 5/2010 | Itagaki et al. |
| 2010/0117073 A1 | 5/2010 | Yamazaki et al. |
| 2010/0117086 A1* | 5/2010 | Akimoto et al. ............ 257/57 |
| 2010/0163867 A1 | 7/2010 | Yamazaki et al. |
| 2010/0163868 A1 | 7/2010 | Yamazaki et al. |
| 2011/0001136 A1 | 1/2011 | Hasegawa et al. |
| 2011/0031492 A1 | 2/2011 | Yamazaki et al. |
| 2011/0084269 A1 | 4/2011 | Yamazaki et al. |
| 2011/0084272 A1 | 4/2011 | Miyanaga et al. |
| 2011/0210328 A1 | 9/2011 | Yamazaki et al. |
| 2011/0212571 A1 | 9/2011 | Yamazaki et al. |
| 2011/0215318 A1 | 9/2011 | Yamazaki et al. |
| 2011/0215319 A1 | 9/2011 | Yamazaki et al. |
| 2013/0092932 A1 | 4/2013 | Yamazaki et al. |
| 2013/0214270 A1 | 8/2013 | Yamazaki |

FOREIGN PATENT DOCUMENTS

| | | |
|---|---|---|
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165527 A | 6/2006 |
| JP | 2006-165528 A | 6/2006 |
| JP | 2007-073702 A | 3/2007 |
| JP | 2007-096055 A | 4/2007 |
| JP | 2007-123861 A | 5/2007 |
| JP | 2007-142196 A | 6/2007 |
| JP | 2007-284342 A | 11/2007 |
| JP | 2008-235871 A | 10/2008 |
| JP | 2009-123957 A | 6/2009 |

(56) References Cited

FOREIGN PATENT DOCUMENTS

| | | | |
|---|---|---|---|
| JP | 2009-141002 A | 6/2009 | |
| JP | 2009-194208 A | 8/2009 | |
| JP | 2009-206388 A | 9/2009 | |
| JP | 2009-224357 A | 10/2009 | |
| JP | 2009-231664 A | 10/2009 | |
| KR | 2004080963 | * | 9/2004 |
| TW | 200721505 | 6/2007 | |
| TW | 200901481 | 1/2009 | |
| TW | 200908341 | 2/2009 | |
| WO | 2004/114391 A1 | 12/2004 | |
| WO | 2008/105347 A1 | 9/2008 | |
| WO | WO-2009/072532 | 6/2009 | |

OTHER PUBLICATIONS

Herbert B. Michaelson; "Work Functions of the Elements"; Journal of Applied Physics / vol. 21 / Issue 6, 536 (1950).*

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane" SID Digest '09 : SID International Symposium Digest of Technical Papers, May 31, 2008, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters) , Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters) , 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2008, pp. 983-985.

Kanno, H et al., "White Stacked Electrophosphorecent Organic Light-Emitting Devices Employing Moo3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems,", Journal of Solid-State Circuits , 2008, vol. 43, No. 1, pp. 292-299.

Lany, S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Lee, H et al., "Current Status of, Challenges to, and Perspective View of AM-OLED ,", IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355

(56) References Cited

OTHER PUBLICATIONS

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure." NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White TANDEM OLEDS," SID Digest '09 : SID International Symposium Digest of Technial Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn—Oxide TFTs With a Novel Passivation Layer," SID Digest '09 : SID International Symposium Digest of Technical Papers, May 31, 200, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor,", Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report, PCT Application No. PCT/JP2010/065883, dated Nov. 2, 2010, 3 pages.

Written Opinion, PCT Application No. PCT/JP2010/065883, dated Nov. 2, 2010, 5 pages.

Taiwanese Office Action (Application No. 099132823) Dated Aug. 24, 2015.

\* cited by examiner

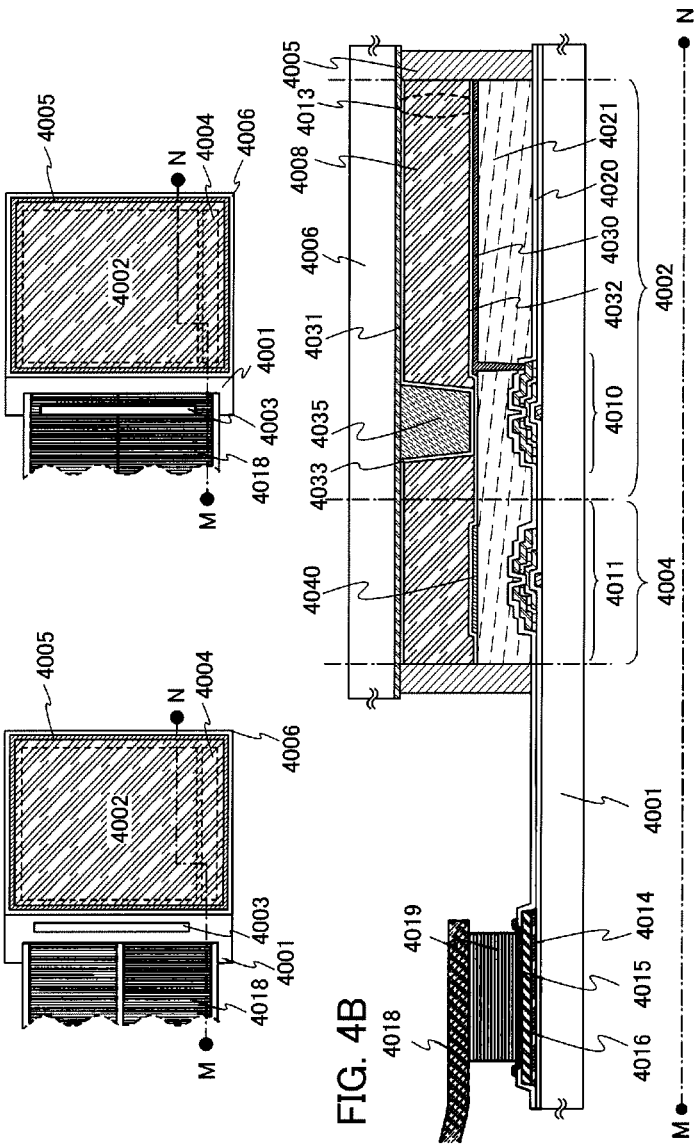

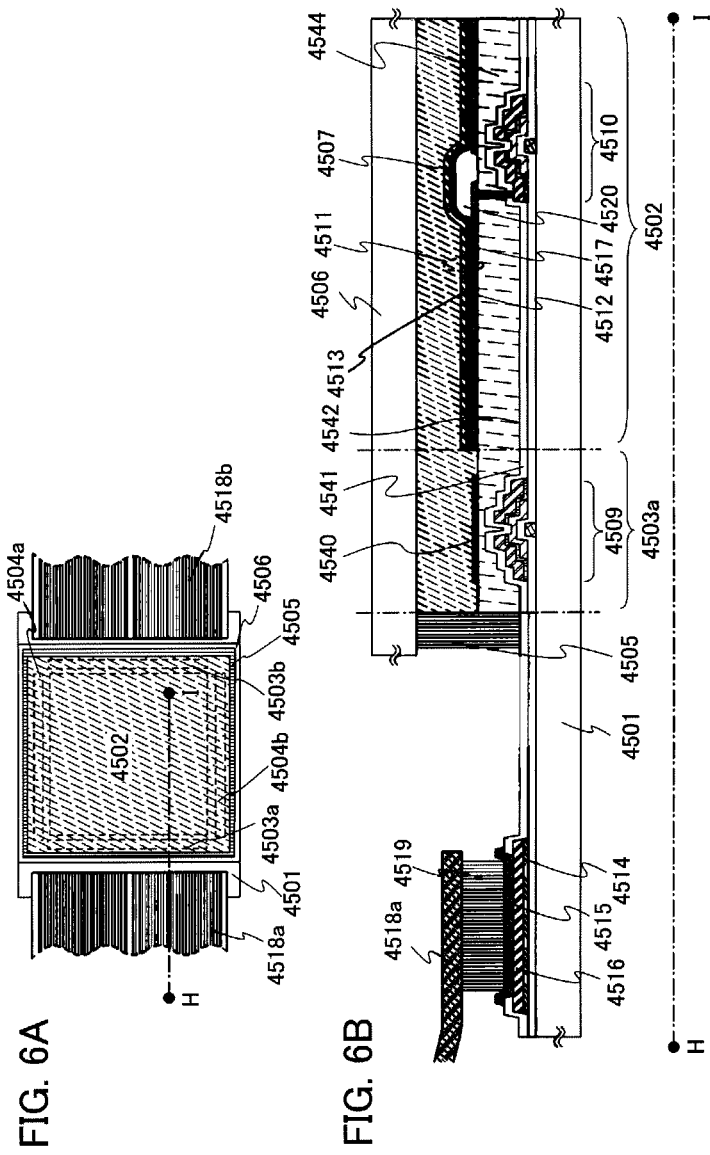

SEMICONDUCTOR DEVICE AND METHOD FOR MANUFACTURING THE SEMICONDUCTOR DEVICE

TECHNICAL FIELD

The present invention relates to a semiconductor device including a circuit formed using a thin film transistor (hereinafter referred to as TFT) and a manufacturing method thereof. For example, the present invention relates to electro-optical devices typified by liquid crystal display panels, or electronic devices which have light-emitting display devices including an organic light-emitting element as a component.

In this specification, a semiconductor device generally means a device which can function by utilizing semiconductor characteristics, and an electrooptic device, a semiconductor circuit, and electronic equipment are all semiconductor devices.

BACKGROUND ART

In recent years, a technique for forming a thin film transistor (TFT) by using a semiconductor thin film (having a thickness of approximately several nanometers to several hundred nanometers) formed over a substrate having an insulating surface has attracted attention. Thin film transistors are applied to a wide range of electronic devices such as ICs or electro-optical devices, and prompt development of thin film transistors that are to be used as switching elements in image display devices, in particular, is being pushed.

In addition, there are various kinds of metal oxides, which are used for a wide range of applications. Indium oxide is a well-known material and is used as a light-transmitting electrode material which is necessary for liquid crystal displays and the like. Some metal oxides have semiconductor characteristics. The examples of such metal oxides having semiconductor characteristics include tungsten oxide, tin oxide, indium oxide, zinc oxide, and the like. A thin film transistor in which a channel formation region is formed using such metal oxides having semiconductor characteristics is already known (for example, see Patent Documents 1 and 2).

REFERENCE

[Patent Document 1] Japanese Published Patent Application No. 2007-123861
[Patent Document 2] Japanese Published Patent Application No. 2007-096055

DISCLOSURE OF INVENTION

An object of an embodiment of the present invention is to provide a thin film transistor including an oxide semiconductor layer, in which a material used for the oxide semiconductor layer and a material used for source and drain electrode layers are prevented from reacting with each other.

Further, an object is to provide a thin film transistor with high electric characteristics as a thin film transistor including an oxide semiconductor layer.

In an embodiment of the present invention disclosed in this specification, source and drain electrode layers provided over a substrate having an insulating surface have a stacked structure of two or more layers. In the stack of layers, a layer which is in contact with an oxide semiconductor layer is a metal layer including a metal element other than a metal element included in the oxide semiconductor layer. An element selected from Sn, Sb, Se, Te, Pd, Ag, Ni, and Cu; an alloy containing any of these elements as a component; an alloy containing any of these elements in combination; or the like is used for a material of the metal layer.

In addition, another embodiment of the present invention is a semiconductor device in which Pt or Au, which is a metal that is not oxidized, can be used as the material of a metal layer used. In the semiconductor device, an oxide semiconductor layer, a source electrode layer, and a drain electrode layer are provided over a substrate having an insulating surface. The source electrode layer and the drain electrode layer are formed with a stack of layers. In the stack of layers, a layer in contact with the oxide semiconductor layer is a metal layer formed from Au or Pt. Note that the metal layer is formed using a material of a metal element which is different from a metal element included in the oxide semiconductor layer.

A second layer or second and any of subsequent layers in the source and drain electrode layers are formed using a material different from that of a first layer, which is an element selected from Al, Cr, Cu, Ta, Ti, Mo, and W, an alloy containing any of these elements as a component, an alloy containing any of these elements in combination, or the like.

The oxide semiconductor layer is formed using an In—Ga—Zn—O-based, an In—Sn—Zn—O-based, an In—Al—Zn—O-based, a Sn—Ga—Zn—O-based, an Al—Ga—Zn—O-based, a Sn—Al—Zn—O-based, an In—Sn—O-based, an In—Zn—O-based, a Sn—Zn—O-based, an Al—Zn—O-based, an In—O-based, a Sn—O-based, or a Zn—O-based oxide semiconductor layer. Note that in the case where Sn is used as the material of the metal layer, a material which does not include Sn, such as an Al—Ga—Zn—O-based, an In—Zn—O-based, an Al—Zn—O-based, an In—O-based, or a Zn—O-based oxide semiconductor material is used for the oxide semiconductor layer.

With the above structure, at least one of the above objects can be achieved.

An embodiment of the present invention to obtain the above structure is a method for manufacturing a semiconductor device, in which a gate electrode layer is formed over a substrate having an insulating surface; a gate insulating layer is formed over the gate electrode layer; an oxide semiconductor layer is formed over the gate insulating layer; a stack of a first metal layer containing a metal element other than a metal element included in the oxide semiconductor layer, and a second metal layer over the oxide semiconductor layer is deposited; and the first metal layer and the second metal layer are selectively etched, so that source and drain electrode layers having a stacked structure of the first metal layer and the second metal layer are formed. The element included in the first metal layer is at least one selected from Sn, Sb, Se, Te, Pd, Ag, Ni, Cu, Pt, and Au.

A bottom-gate thin film transistor can be manufactured in accordance with the above manufacturing method.

Further, in the case where an inverted coplanar (also referred to as bottom-contact) thin film transistor is manufactured, a gate electrode layer is formed over a substrate having an insulating surface; a gate insulating layer is formed over the gate electrode layer; a stack of a first metal layer and a second metal layer is formed over the gate insulating layer; the first metal layer and the second metal layer are selectively etched, so that source and drain electrode layers having a stacked structure of the first metal layer and the second metal layer are formed; and an oxide semiconductor layer is formed over the source and drain electrode layers. An element included in the second metal layer is a metal element other than a metal element included in the oxide semiconductor layer and at least one selected from Sn, Sb, Se, Te, Pd, Ag, Ni, Cu, Pt, and Au.

In the structure of each of the manufacturing methods, the first metal layer and the second metal layer are deposited by a sputtering method or an evaporation method. In addition, it is preferable that the second metal layer be deposited over the first metal layer without exposure to the air after deposition of the first metal layer.

Further, in the case where a metal or an alloy with which it is difficult to manufacture a target is used as a metal layer in contact with the oxide semiconductor layer, a pellet of a different metal is put over a metal target and then successive deposition is performed by a sputtering method. In this case, deposition can be performed in one sputtering apparatus without exposure to the air. Although depending on sputtering conditions, a mixed layer of a material of the metal target and the metal material of the pellet is formed in some cases. In addition, sputtering may be performed in the state where a plurality of metal pellets is arranged over a metal target. The pellet has a columnar shape with a diameter of 5 mm to 50 mm and a height of 2 mm to 30 mm. Note that there is no particular limitation on the shape of the pellet. The pellet can be a cube, a rectangular solid, an elliptical cylinder, or the like.

The term "successive deposition" in this specification means that during a series of a first deposition step by a sputtering method (an evaporation method, or the like) and a second deposition step by a sputtering method (an evaporation method, or the like), an atmosphere in which a substrate to be processed is disposed is not contaminated by a contaminant atmosphere such as air, and is constantly controlled to be vacuum or an inert gas atmosphere (a nitrogen atmosphere or a rare gas atmosphere). By the successive deposition, deposition can be conducted to a substrate which has been cleaned, without re-attachment of moisture or the like.

Performing the process from the first deposition step to the second film formation step in the same chamber is within the scope of the successive deposition in this specification.

In addition, the following is also within the scope of the successive deposition in this specification: in the case of performing the process from the first deposition step to the second film formation step in plural chambers, the substrate is transferred after the first deposition step to another chamber without being exposed to air and subjected to the second deposition.

Note that between the first deposition step and the second deposition step, a substrate transfer step, an alignment step, a slow-cooling step, a step of heating or cooling the substrate to a temperature which is necessary for the second deposition step, or the like may be provided. Such a process is also within the scope of the successive deposition in this specification.

However, the case where there is a step in which liquid is used, such as a cleaning step, wet etching, or resist formation, between the first deposition step and the second deposition step is not in the range of the successive deposition in this specification.

In a thin film transistor including an oxide semiconductor layer, a metal material included in source and drain electrode layers and a material included in the oxide semiconductor layer are prevented from reacting with each other, so that the thin film transistor having high frequency characteristics (referred to as f characteristics) can be obtained.

BRIEF DESCRIPTION OF DRAWINGS

In the accompanying drawings:

FIGS. 4A1 and 4A2 and FIG. 4B are top views and a cross-sectional view illustrating an embodiment of the present invention;

FIGS. 6A and 6B are a plan view and a cross-sectional view illustrating an embodiment of the present invention;

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

[Embodiment 1]

Figure 1A:
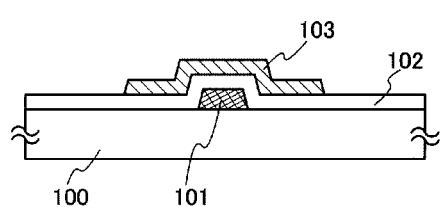
FIGS. 1A to 1D are cross-sectional views illustrating an embodiment of the present invention.
Figure 1B:
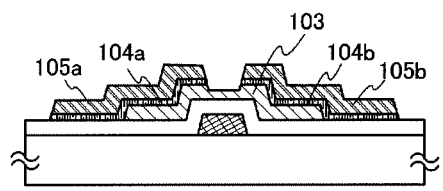
Figure 1C:
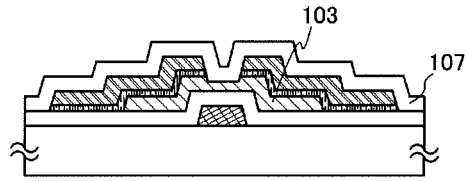
Figure 1D:
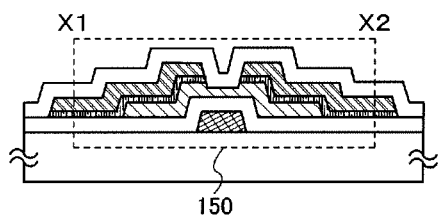

In this embodiment, one mode of a method for manufacturing a thin film transistor 150 illustrated in FIG. 1D is described with reference to FIGS. 1A to 1D which are cross-sectional views illustrating the manufacturing steps of a thin film transistor. The thin film transistor 150 has one of bottom-gate structures.

It is preferable that a glass substrate be used as a substrate 100. As a glass substrate used for the substrate 100, if a temperature of heat treatment to be performed later is high, a glass substrate whose strain point is 730° C. or higher is preferably used. Further, as a material of the substrate 100, for example, a glass material such as aluminosilicate glass, aluminoborosilicate glass, or barium borosilicate glass is used. Note that by containing a larger amount of barium oxide (BaO) than that of boric oxide, a glass substrate is heat-resistant and of more practical use. Therefore, a glass substrate containing BaO and $B_2O_3$ so that the amount of BaO is larger than that of $B_2O_3$ is preferably used.

Note that a substrate formed from an insulator such as a ceramic substrate, a quartz glass substrate, a quartz substrate, or a sapphire substrate may be used instead of the substrate 100. Alternatively, a crystallized glass substrate or the like may be used.

An insulating layer serving as a base layer may be provided between the substrate 100 and a gate electrode layer 101. The base layer has a function of preventing diffusion of an impurity element from the substrate 100, and can be formed with a single-layer or stacked-layer structure using one or more of a silicon nitride layer, a silicon oxide layer, a silicon nitride oxide layer, and a silicon oxynitride layer.

As the gate electrode layer 101, a metal conductive layer can be used. As the material of the metal conductive layer, an element selected from Al, Cr, Cu, Ta, Ti, Mo, and W; an alloy containing any of these elements as a component; an alloy containing any of these elements in combination; or the like is preferably used. For example, a three-layer structure in which an aluminum layer is stacked over a titanium layer and a titanium layer is stacked over the aluminum layer, or a three-layer structure in which an aluminum layer is stacked over a molybdenum layer and a molybdenum layer is stacked over the aluminum layer is preferable. It is needless to say that the metal conductive layer can be a single layer, a two-layer, or a stacked structure in which four or more Layers are stacked.

Then, a gate insulating layer 102 is formed over the gate electrode layer 101.

In this embodiment, formation of the gate insulating layer 102 is performed with a high-density plasma apparatus. Here, a high-density plasma apparatus refers to an apparatus which can realize a plasma density of $1 \times 10^{11}/cm^3$ or higher. For example, plasma is generated by applying a microwave power of 3 kW to 6 kW so that the insulating film is formed.

A monosilane gas ($SiH_4$), nitrous oxide ($N_2O$), and a rare gas are introduced into a chamber as a source gas to generate high-density plasma at a pressure of 10 Pa to 30 Pa so that an insulating film is formed over a substrate having an insulating surface, such as a glass substrate. After that, supply of a monosilane gas may be stopped, and nitrous oxide ($N_2O$) and a rare gas may be introduced without exposure to the air to perform plasma treatment on a surface of the insulating film. The plasma treatment performed on the surface of the insulating film by introducing nitrous oxide ($N_2O$) and a rare gas is performed at least after the insulating film is formed. The insulating film formed through the above process procedure has a small thickness and corresponds to an insulating film whose reliability can be ensured even though it has a thickness less than 100 nm, for example.

In forming the gate insulating layer 102, the flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

In addition, since the insulating film formed by using the high-density plasma apparatus can have a certain thickness, the insulating film has excellent step coverage. Further, by using the high-density plasma apparatus, the thickness of the thin insulating film can be controlled precisely.

Unlike an insulating film formed by using a conventional parallel plate PCVD apparatus in many points, the insulating film formed through the above process procedure has an etching rate which is lower than that of the insulating film formed by using the conventional parallel plate PCVD apparatus by 10% or more or 20% or more in the case where the etching rates with the same etchant are compared to each other. Thus, it can be said that the insulating film obtained by the high-density plasma apparatus is a dense film.

In this embodiment, as the gate insulating layer 102, a silicon oxynitride film (also referred to as $SiO_xN_y$, where x>y>0) with a thickness of 100 nm formed by a high-density plasma apparatus is used.

Next, over the gate insulating layer 102, an oxide semiconductor film is formed to a thickness of greater than or equal to 5 nm and less than or equal to 200 nm, preferably greater than or equal to 10 nm and less than or equal to 50 nm. Further, the oxide semiconductor film can be deposited by a sputtering method in a rare gas (typically argon) atmosphere, an oxygen atmosphere, or an atmosphere containing a rare gas (typically argon) and oxygen.

The oxide semiconductor film is formed using an In—Ga—Zn—O-based, an In—Sn—Zn—O-based, an In—Al—Zn—O-based, a Sn—Ga—Zn—O-based, an Al—Ga—Zn—O-based, a Sn—Al—Zn—O-based, an In—Zn—O-based, an In—Sn—O-based, a Sn—Zn—O-based, an Al—Zn—O-based, an In—O-based, a Sn—O-based, or a Zn—O-based oxide semiconductor layer. In this embodiment, for example, the oxide semiconductor film is deposited using an In—Ga—Zn—O-based oxide semiconductor target for deposition by a sputtering method.

In addition, it is preferable that an oxide semiconductor contained in the oxide semiconductor target for deposition has a relative density of 80% or more, preferably 95% or more, more preferably 99.9% or more. When a target having a high relative density is used, the impurity concentration of an oxide semiconductor film to be formed can be reduced, so that a thin film transistor with excellent electric characteristics or high reliability can be obtained.

In addition, before deposition of the oxide semiconductor film, pre-heat treatment is preferably performed in order to remove moisture or hydrogen which remains on an inner wall of a sputtering apparatus, on a target surface, or in the material of the target. As the pre-heat treatment, a method in which the inside of the deposition chamber is heated to 200° C. to 600° C. under a reduced pressure, a method in which introduction and exhaust of nitrogen or an inert gas are repeated while the inside of the deposition chamber is heated, or the like is given. In this case, not water but oil or the like is preferably used as a coolant for the target. Although a certain level of effect can be obtained when introduction and exhaust of nitrogen are repeated without heating, it is more preferable to perform the treatment with the inside of the deposition chamber heated. After the pre-heat treatment is performed, the substrate or the sputtering apparatus is cooled and then the oxide semiconductor film is deposited.

In addition, when deposition by a sputtering method is performed, the substrate may be heated to a temperature of higher than or equal to 400° C. and lower than or equal to 700° C.

In addition, it is preferable that moisture or the like which remains in the sputtering apparatus is removed using a cryopump before, during, or after deposition of the oxide semiconductor film.

Further, the gate insulating layer 102 and the oxide semiconductor film may be formed successively without exposure to air. Deposition without exposure to air makes it possible to obtain an interface between the stacked layers, which is not contaminated by atmospheric components or impurity elements floating in air, such as water or hydrocarbon. Therefore, variation in characteristics of the thin film transistor can be reduced.

Next, the oxide semiconductor film is processed into an island-shaped oxide semiconductor layer 103 by a photolithography step (see FIG. 1A). Further, a resist mask for formation of the island-shaped oxide semiconductor layer may be formed by an inkjet method. Formation of the resist mask by an inkjet method needs no photomask; thus, manufacturing cost can be reduced.

Then, first heat treatment is performed, so that dehydration or dehydrogenation of the oxide semiconductor layer 103 is performed. The maximum temperature during the first heat treatment for dehydration or dehydrogenation is higher than or equal to 350° C. and lower than or equal to 750° C., preferably 425° C. or higher. Note that in the case of the temperature that is 425° C. or higher, the heat treatment time may be 1 hour or shorter, whereas in the case of the temperature lower than 425° C., the heat treatment time is longer than 1 hour. In this embodiment, heat treatment is performed in a nitrogen atmosphere in a furnace at 450° C. for 1 hour.

Note that in the first heat treatment, it is preferable that water, hydrogen, and the like be not contained in nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

In addition, in the first heat treatment, a heating method with the use of an electric furnace can be used. Note that in the first heat treatment, a heat treatment apparatus is not limited to an electric furnace, and may be provided with a device which heats an object by utilizing heat conduction or thermal radiation from a heater such as a resistance heater. For example, a rapid thermal anneal apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus in which heat treatment is performed using a high-temperature gas. As a gas, an inert gas which hardly reacts with an object by heat treatment, such as nitrogen or a rare gas such as argon is used.

Next, a stack of conductive layers for forming source and drain electrode layers is deposited over the gate insulating layer 102 and the oxide semiconductor layer 103.

A first metal layer is deposited to a thickness of greater than or equal to 1 nm and less than or equal to 50 nm on and in contact with the oxide semiconductor layer 103, and then a conductive layer as a second metal layer formed from an element selected from Al, Cr, Cu, Ta, Ti, Mo, and W; an alloy containing any of these elements as a component; or an alloy containing any of these elements in combination is stacked thereover.

In this embodiment, a stacked structure of four layers in which a first molybdenum layer, an aluminum layer, and a second molybdenum layer are stacked over a tin-mixed layer with a thickness of greater than or equal to 1 nm and less than or equal to 50 nm which is smaller than that of the oxide semiconductor layer is employed. The four layers are successively stacked without exposure to the air in one multi-source sputtering apparatus in which a plurality of targets of different materials can be set, with the use of a first molybdenum target on which a pellet of tin is put, a second molybdenum target without a pellet, and an aluminum target. Note that the tin-mixed layer is the thinnest layer among the four layers and thinner than the oxide semiconductor layer. By successive deposition, oxidation and increase in resistance of the thin tin-mixed layer are prevented.

Although the tin-mixed layer is described in this embodiment as an example of a layer which is included in each of the stacks of the source and drain electrode layers and in contact with the oxide semiconductor layer, this embodiment is not limited thereto. At least one element selected from Sb, Se, Te, Pd, Ag, Ni, Cu, Pt, and Au is used.

Then, a photolithography step is performed with the use of a photomask, and the stack of the four layers for forming the source and drain electrode layers is selectively etched, so that source electrode layers 104a and 105a and drain electrode layers 104b and 105b having stacked structures are formed (see FIG. 1B). Note that the tin-mixed layer on and in contact with the oxide semiconductor layer 103 corresponds to the source electrode layer 104a and the drain electrode layer 104b among the source and drain electrode layers. In addition, part of oxide semiconductor layer 103 is also etched at this time, so that the oxide semiconductor layer 103 has a groove (a recessed portion). Note that depending on the material of the oxide semiconductor layer 103, the material of the source and drain electrode layers, or etching conditions, the oxide semiconductor layer 103 does not have the groove (recessed portion) in some cases. For example, the layer which is in the stacks of the source and drain electrode layers and is in contact with the oxide semiconductor layer can also function as an etching stopper when Au or Pt is used thereto.

Next, a protective insulating layer 107 which covers the gate insulating layer 102, the oxide semiconductor layer 103, the source electrode layers 104a and 105a, and the drain electrode layers 104b and 105b and which is in contact with part of the oxide semiconductor layer 103 is formed (see FIG. 1C). The protective insulating layer 107 can be deposited to a thickness of at least 1 nm or more using a method by which impurities such as water and hydrogen are prevented from being mixed to the protective insulating layer 107, such as a CVD method or a sputtering method, as appropriate. Here, the protective insulating layer 107 is formed using a reactive sputtering method, which is one kind of a sputtering method. The protective insulating layer 107 which is in contact with part of the oxide semiconductor layer 103 does not contain impurities such as moisture, hydrogen ions, and OH⁻, and is formed using an inorganic insulating layer which prevents entry of these from the outside. Specifically, a silicon oxide layer, a silicon nitride oxide layer, a silicon nitride layer, an aluminum oxide layer, an aluminum oxynitride layer, or an aluminum nitride layer can be used.

In addition, the protective insulating layer 107 may have a structure in which a silicon nitride layer or an aluminum nitride layer is stacked over a silicon oxide layer, a silicon nitride oxide layer, an aluminum oxide layer, or an aluminum oxynitride layer. In particular, the silicon nitride film does not contain impurities such as moisture, a hydrogen ion, and OH⁻ and prevents the impurities from entering from the outside.

A substrate temperature when the protective insulating layer 107 is deposited may be room temperature or higher and 300° C. or lower. Deposition of the silicon oxide layer by a sputtering method can be performed in a rare gas (typically, argon) atmosphere, an oxygen atmosphere, or a mixed atmosphere of a rare gas (typically, argon) and oxygen. As a target, a silicon oxide target or a silicon target may be used. For example, with use of a silicon target, a silicon oxide layer can be formed by a sputtering method in an atmosphere of oxygen and a rare gas. In this embodiment, a silicon oxide layer with a thickness of 300 nm deposited using a silicon target is used as the protective insulating layer 107.

Through the above steps, the bottom-gate thin film transistor 150 can be formed. In the bottom-gate thin film transistor 150, the gate electrode layer 101 is provided over the substrate 100, which is a substrate having an insulating surface; the gate insulating layer 102 is provided over the gate electrode layer 101; the oxide semiconductor layer 103 is provided over the gate insulating layer 102; the source electrode layers 104a and 105a and the drain electrode layers 104b and 105b which are formed from the stack are provided over the oxide semiconductor layer 103; and the protective insulating layer 107, which covers the gate insulating layer 102, the oxide semiconductor layer 103, the source electrode layers 104a and 105a, and the drain electrode layers 104b and 105b, and which is in contact with the part of the oxide semiconductor layer 103 is provided (see FIG. 1D).

Figure 2:
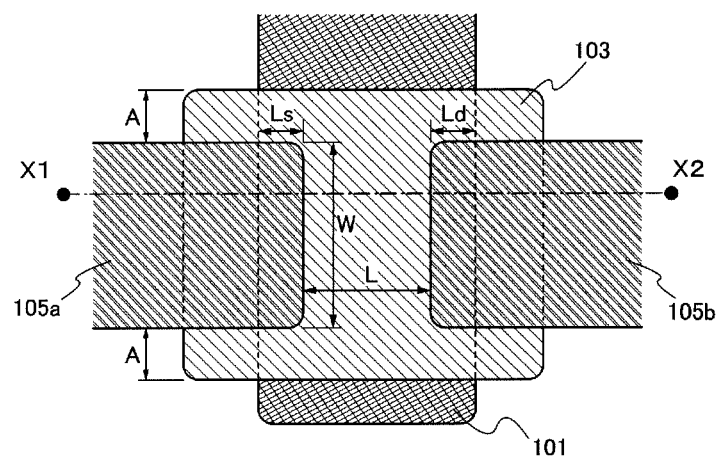
FIG. 2 is a top view illustrating an embodiment of the present invention.

FIG. 2 is a top view of the thin film transistor 150 described in this embodiment. FIG. 1D illustrates a cross-sectional structure of a portion taken along X1-X2 in FIG. 2. In FIG. 2, L represents a channel length and W represents a channel width. In addition, A represents the length of a region where the oxide semiconductor layer 103 does not overlap with the source electrode layer 105a and the drain electrode layer 105*b* in a direction parallel to the channel width direction. Ls represents the length of a region where the source electrode layer 105*a* and the gate electrode layer 101 overlap with each other, and Ld represents the length of a region where the drain electrode layer 105*b* and the gate electrode layer 101 overlap with each other.

In addition, if needed, after the silicon oxide film with a thickness of 300 nm is formed as the protective insulating layer 107, second heat treatment may be performed at a temperature of higher than or equal to 100° C. and lower than or equal to 400° C. In this embodiment, heating is performed for 10 hours at a substrate temperature of 150° C. By this second heat treatment, a thin film transistor with high reliability can be manufactured.

In addition, the timing of the second heat treatment is not limited to just after formation of the protective insulating layer 107. The second heat treatment may be performed after a wiring or an electrode (for example, a pixel electrode) is formed over the protective insulating layer 107.

Figure 3A:
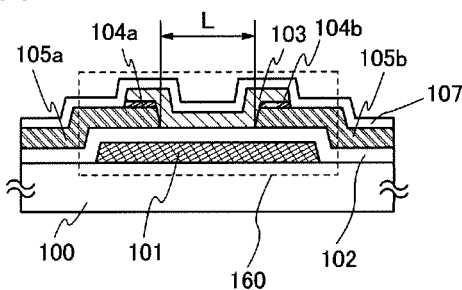
FIGS. 3A to 3C are cross-sectional views each illustrating an embodiment of the present invention.
Figure 3B:
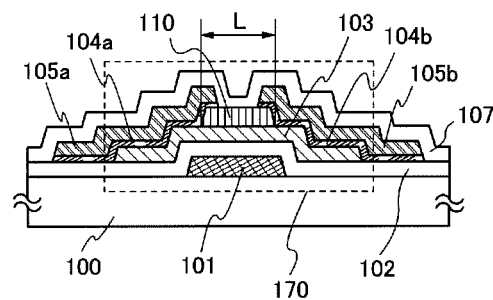
Figure 3C:
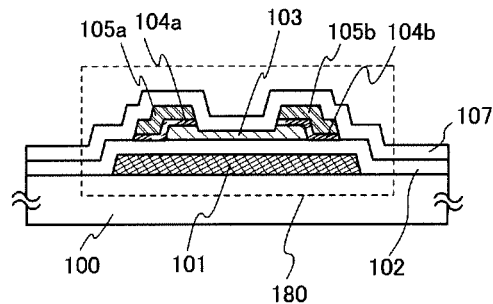

Further, although the method for manufacturing the bottom-gate thin film transistor 150 illustrated in FIG. 1D is described in this embodiment, this embodiment is not limited to this structure. A bottom-contact (also referred to as an inverted-coplanar) thin film transistor 160 having a bottom-gate structure as illustrated in FIG. 3A, a channel-protective (also referred to as a channel-stop) thin film transistor 170 including a channel protective layer 110 as illustrated in FIG. 3B, and the like can be formed using the same materials and the same method. FIG. 3C illustrates another example of a channel-etch thin film transistor. A thin film transistor 180 illustrated in FIG. 3C has a structure in which the gate electrode layer 101 extends to the outside of edge portions of the oxide semiconductor layer 103.

In addition, in order to reduce the number of photomasks and the number of steps for the photolithography step, etching may be performed with the use of a resist mask formed using a multi-tone mask which is a light-exposure mask through which light is transmitted to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed by using a multi-tone mask. Thus, the number of light-exposure masks can be reduced and the number of corresponding photolithography steps can be also reduced, whereby simplification of a process can be realized.

Note that the channel length (L in FIG. 2) is defined by a distance between the source electrode layer 105*a* and the drain electrode layer 105*b*, and a channel length of the channel-protective thin film transistor is defined by the width of a channel protective layer in a direction parallel to a direction in which carriers flow.

[Embodiment 2]

In this embodiment, a thin film transistor is manufactured, and a semiconductor device having a display function (also referred to as a display device) is manufactured using the thin film transistor for a pixel portion and further for a driver circuit. In addition, a thin film transistor for part or the whole of a driver circuit is formed over a substrate over which a thin film transistor of a pixel portion is formed, so that a system-on-panel can be formed.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC or the like including a controller is mounted on the panel. The display device relates to one mode of an element substrate before the display element is completed in a manufacturing process of the display device, and the element substrate is provided with a means for supplying a current to the display element in each of a plurality of pixels. Specifically, the element substrate may be in a state after only a pixel electrode of the display element is formed, a state after a conductive layer to be a pixel electrode is formed and before the conductive layer is etched to form the pixel electrode, or any of other states.

Note that a display device in this specification means an image display device, a display device, or a light source (including a lighting device). Further, the display device includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

In this embodiment, an example of a liquid crystal display device is described as a semiconductor device which is one mode of the present invention. First, the appearance and a cross section of a liquid crystal display panel, which is one mode of a semiconductor device, will be described with reference to FIGS. 4A1, 4A2, and 4B. Each of FIGS. 4A1 and 4A2 is a top view of a panel in which thin film transistors 4010 and 4011 which include a semiconductor layer of an In—Ga—Zn—O-based layer, and a liquid crystal element 4013, which are formed over a first substrate 4001, are sealed between the first substrate 4001 and a second substrate 4006 with a sealant 4005. FIG. 4B corresponds to a cross-sectional view of FIGS. 4A1 and 4A2 along line M-N.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed from a single crystal semiconductor or a polycrystalline semiconductor over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 4A1 illustrates an example of mounting the signal line driver circuit 4003 by a COG method, and FIG. 4A2 illustrates an example of mounting the signal line driver circuit 4003 by a TAB method.

Further, the pixel portion 4002 and the scan line driver circuit 4004 provided over the first substrate 4001 each include a plurality of thin film transistors. FIG. 4B illustrates the thin film transistor 4010 included in the pixel portion 4002 and the thin film transistor 4011 included in the scan line driver circuit 4004. Over the thin film transistors 4010 and 4011, insulating layers 4020 and 4021 are provided.

The thin film transistor including the oxide semiconductor layer which is described in Embodiment 1 can be used for the thin film transistors 4010 and 4011. Note that source electrode layers and drain electrode layers of the thin film transistors 4010 and 4011 are formed using a stack of a Cu layer and a tungsten layer, in which the Cu layer is in contact with the oxide semiconductor layer. In this embodiment, the thin film transistors 4010 and 4011 are n-channel thin film transistors.

A conductive layer 4040 is provided over the insulating layer 4021 to overlap with a channel formation region of the oxide semiconductor layer of the thin film transistor 4011 for a driver circuit. The conductive layer 4040 is provided in the position overlapping with the channel formation region of the oxide semiconductor layer, whereby the amount of change in the threshold voltage of the thin film transistor 4011 before and after a BT test can be reduced. In addition, electrostatic blocking can be performed by providing the conductive layer 4040 in a portion overlapping with the thin film transistor 4011 for a driver circuit, so that a normally-off thin film transistor can be obtained. Electrostatic blocking refers to blocking an electric field of the outside, that is, preventing action of an electric field of the outside on the inside (a circuit including TFT and the like). The amount of change in the threshold voltage of the thin film transistor 4011 before and after the BT test can be reduced. A potential of the conductive layer 4040 may be the same or different from that of a gate electrode layer of the thin film transistor 4011. The conductive layer 4040 can also function as a second gate electrode layer. Alternatively, the potential of the conductive layer 4040 may be GND or 0 V, or the conductive layer 4040 may be in a floating state.

A pixel electrode layer 4030 included in the liquid crystal element 4013 is electrically connected to the thin film transistor 4010. A counter electrode layer 4031 of the liquid crystal element 4013 is provided for the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 therebetween.

Note that the first substrate 4001 and the second substrate 4006 can be formed of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

A columnar spacer denoted by a reference numeral 4035 which can be obtained in such a manner that an insulating layer is selectively etched is provided to control a distance (a cell gap) between the pixel electrode layer 4030 and the counter electrode layer 4031. Alternatively, a spherical spacer may also be used. In addition, the counter electrode layer 4031 is electrically connected to a common potential line formed over the same substrate as the thin film transistor 4010. In addition, with the use of a common connection portion, the counter electrode layer 4031 and the common potential line can be electrically connected to each other by conductive particles arranged between the pair of substrates. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal layer 4008. The liquid crystal composition which includes a liquid crystal showing a blue phase and a chiral agent has a short response time of 1 msec or less, has optical isotropy, which makes the alignment process unneeded, and has a small viewing angle dependence.

When liquid crystal exhibiting a blue phase is used, rubbing treatment on an alignment film is unnecessary; accordingly, electrostatic discharge damage caused by the rubbing treatment can be prevented and defects and damage of the liquid crystal display device in the manufacturing process can be reduced. Thus, productivity of the liquid crystal display device can be increased. A thin film transistor that uses an oxide semiconductor layer particularly has a possibility that electric characteristics of the thin film transistor may fluctuate significantly by the influence of static electricity and deviate from the designed range. Therefore, it is more effective to use a blue phase liquid crystal material for a liquid crystal display device including a thin film transistor that uses an oxide semiconductor layer.

Note that the liquid crystal display device described in this embodiment is an example of a transmissive liquid crystal display device; however, the liquid crystal display device can be applied to either a reflective liquid crystal display device or a semi-transmissive liquid crystal display device.

An example of the liquid crystal display device described in this embodiment is illustrated in which a polarizing plate is provided on the outer surface of the substrate (on the viewer side) and a coloring layer and an electrode layer used for a display element are provided on the inner surface of the substrate in that order; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process. Furthermore, a light-blocking layer serving as a black matrix may be provided as needed.

In this embodiment, in order to reduce surface unevenness caused by the thin film transistors and to improve reliability of the thin film transistors, the thin film transistors are covered with a protective layer or the insulating layers (the insulating layer 4020 and the insulating layer 4021) which function as planarizing insulating layers. Note that the protective layer is provided to prevent entry of a contaminant impurity such as an organic substance, a metal substance, or moisture floating in air and is preferably a dense film. The protective layer may be deposited using a single layer or a stack of layers of a silicon oxide layer, a silicon nitride layer, a silicon oxynitride layer, a silicon nitride oxide layer, an aluminum oxide layer, an aluminum nitride layer, an aluminum oxynitride layer, or an aluminum nitride oxide layer by a sputtering method. In this embodiment, an example in which the protective layer is deposited by a sputtering method is described; however, there is no particular limitation on a method, and various kinds of methods may be used.

Here, the insulating layer 4020 having a stacked structure is formed as the protective layer. Here, as a first layer of the insulating layer 4020, a silicon oxide layer is deposited by a sputtering method. In the case where an aluminum layer is used for the source electrode layer and the drain electrode layer, the use of the silicon oxide layer as the protective layer has the effect of preventing a hillock of the aluminum layer used.

An insulating layer is formed as a second layer of the protective layer. Here, as the second layer of the insulating layer 4020, a silicon nitride layer is deposited by a sputtering method. The use of the silicon nitride layer as the protective layer can prevent ions such as sodium ions from entering a semiconductor region, thereby suppressing variations in electric characteristics of the TFT.

The insulating layer 4021 is formed as the planarizing insulating layer. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating layers formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method of forming the insulating layer 4021, and the following method or means can be employed depending on the material: a method such as a sputtering method, an SOG method, a spin coating method, a dipping method, a spray coating method, or a droplet discharge method (e.g., an ink-jet method, screen printing, or offset printing), or a tool such as a doctor knife, a roll coater, a curtain coater, or a knife coater. In a case of forming the insulating layer 4021 using a material solution, annealing (300° C. to 400° C.) of the semiconductor layer may be performed at the same time as a baking step. The baking step of the insulating layer 4021 also serves as annealing of the semiconductor layer, whereby a semiconductor device can be manufactured efficiently.

The pixel electrode layer 4030 and the counter electrode layer 4031 can be made of a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

Conductive compositions including a conductive high molecule (also referred to as a conductive polymer) can be used for the pixel electrode layer 4030 and the counter electrode layer 4031. The pixel electrode formed using the conductive composition has preferably a sheet resistance of less than or equal to 10000 Ω/square and a transmittance of 70% or more at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

In this embodiment, a connection terminal electrode 4015 is formed using the same conductive layer as the pixel electrode layer 4030 included in the liquid crystal element 4013. A terminal electrode 4016 is formed using the same conductive layer as the source and drain electrode layers included in the thin film transistors 4010 and 4011. Accordingly, the terminal electrode 4016 is formed with a stack of a Cu layer and a tungsten layer.

The connection terminal electrode 4015 is electrically connected to a terminal included in the FPC 4018 with an anisotropic conductive layer 4019 therebetween.

Although FIGS. 4A1, 4A2, and 4B illustrate an example in which the signal line driver circuit 4003 is formed separately and mounted on the first substrate 4001, this embodiment is not limited to this structure. The scan line driver circuit may be separately formed and then mounted, or only part of the signal line driver circuit or part of the scan line driver circuit may be separately formed and then mounted.

In addition, if needed, a color filter is provided in each of the pixels. In addition, a polarization plate and a diffusing plate are provided on the outer sides of the first substrate 4001 and the second substrate 4006. Further, a light source of a backlight is formed using a cold-cathode tube or an LED. Thus, a liquid crystal display module is obtained.

The liquid crystal display module can employ a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (Anti Ferroelectric Liquid Crystal) mode, or the like.

According to the above steps, it is possible to manufacture a liquid crystal display device having a thin film transistor with excellent electric characteristics.

This embodiment can be implemented by being freely combined with the structure described in Embodiment 1.

[Embodiment 3]

An example of electronic paper will be described as an embodiment of a semiconductor device.

The thin film transistor described in Embodiments 1 can be used for electronic paper in which electronic ink is driven by an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules is arranged as appropriate over an active matrix substrate so as to be interposed between two electrodes, an active matrix display device can be completed, and display can be performed by application of an electric field to the microcapsules. For example, the active matrix substrate obtained by the thin film transistor described in Embodiment 1 can be used.

Note that the first particles and the second particles in the microcapsules may each be formed from a single material selected from a conductive material, an insulating material, a semiconductor material, a magnetic material, a liquid crystal material, a ferroelectric material, an electroluminescent material, an electrochromic material, and a magnetophoretic material, or formed from a composite material of any of these.

Figure 5:
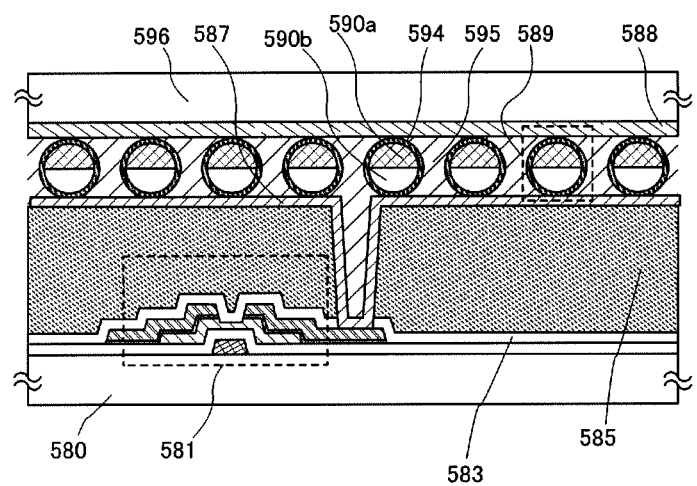
FIG. 5 is a cross-sectional view illustrating an embodiment of the present invention.

FIG. 5 shows active matrix electronic paper as an example of a semiconductor device. A thin film transistor 581 used for the semiconductor device can be manufactured in a similar manner to the thin film transistor described in Embodiment 1, and includes stacks including tin-mixed layers in contact with an oxide semiconductor layer as source and drain electrode layers.

The electronic paper in FIG. 5 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 is a thin film transistor having a bottom-gate structure and is covered with an insulating layer 583 that is in contact with the semiconductor layer. The source electrode layer or the drain electrode layer of the thin film transistor 581 is in contact with a first electrode layer 587 at an opening formed in insulating layers 583 and 585, whereby the thin film transistor 581 is electrically connected to the first electrode layer 587. Between the first electrode layer 587 and a second electrode layer 588, spherical particles 589 are provided. Each spherical particle 589 includes a black region 590*a* and a white region 590*b*, and a cavity 594 filled with liquid around the black region 590*a* and the white region 590*b*. The spherical particles 589 are surrounded by filler 595 such as a resin (see FIG. 5). The first electrode layer 587 corresponds to a pixel electrode, and the second electrode layer 588 corresponds to a common electrode. The second electrode layer 588 is electrically connected to a common potential line provided over the same substrate as the thin film transistor 581. In a common connection portion, the second electrode layer 588 can be electrically connected to the common potential line via conductive particles provided between the substrate 580 and the substrate 596.

Further, instead of the twisting ball, an electrophoretic element can also be used. A microcapsule having a diameter of about 10 µm to 200 µm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides each other, so that white or black can be displayed. The electrophoretic display element has higher reflectivity than a liquid crystal display element. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through the above steps, electronic paper including thin film transistor with high electric characteristics can be manufactured.

This embodiment can be implemented in combination with the structure described in Embodiment 1 as appropriate.

[Embodiment 4]

Next, the appearance and cross section of a light-emitting display panel (also referred to as a light-emitting panel) which corresponds to one mode of a semiconductor device will be described with reference to FIGS. 6A and 6B. FIG. 6A is a plan view of a panel in which a thin film transistor and a light-emitting element formed over a first substrate are sealed between the first substrate and a second substrate with a sealant. FIG. 6B is a cross-sectional view along line H-I of FIG. 6A.

A sealant 4505 is provided so as to surround a pixel portion 4502, signal line driver circuits 4503*a* and 4503*b*, and scan line driver circuits 4504*a* and 4504*b* which are provided over a first substrate 4501. In addition, a second substrate 4506 is provided over the pixel portion 4502, the signal line driver circuits 4503*a* and 4503*b*, and the scan line driver circuits 4504*a* and 4504*b*. Accordingly, the pixel portion 4502, the signal line driver circuits 4503*a* and 4503*b*, and the scan line driver circuits 4504*a* and 4504*b* are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

Further, the pixel portion 4502, the signal line driver circuits 4503*a* and 4503*b*, and the scan line driver circuits 4504*a* and 4504*b* formed over the first substrate 4501 each include a plurality of thin film transistors, and a thin film transistor 4510 included in the pixel portion 4502 and a thin film transistor 4509 included in the signal line driver circuit 4503*a* are illustrated as an example in FIG. 6B.

The thin film transistor described in Embodiment 1, in which a tin-mixed layer is in contact with an oxide semiconductor layer, can be used for the thin film transistors 4509 and 4510. Note that each of source and drain electrode layers of thin film transistors 4509 and 4510 is a stack of a tin-mixed layer and a molybdenum layer. The tin-mixed layer in this stacked structure is in contact with an oxide semiconductor layer. In this embodiment, the thin film transistors 4509 and 4510 are n-channel thin film transistors.

A conductive layer 4540 is provided over part of an insulating layer 4544 so as to overlap with a channel formation region of the oxide semiconductor layer in the thin film transistor 4509 for the driver circuit. When the conductive layer 4540 is provided at least in a portion which overlaps with the channel formation region of the oxide semiconductor layer, the amount of shift in the threshold voltage of the thin film transistor 4509 between before and after a BT test can be reduced. In addition, electrostatic blocking can be performed by providing the conductive layer 4540 in a portion overlapping with the thin film transistor 4509 for a driver circuit, so that a normally-off thin film transistor can be obtained. Further, a potential of the conductive layer 4540 may be the same as or different from that of a gate electrode layer of the thin film transistor 4509. The conductive layer 4540 can function also as a second gate electrode layer. Alternatively, the potential of the conductive layer 4540 may be GND or 0 V, or the conductive layer 4540 may be in a floating state.

In the thin film transistor 4509, an insulating layer 4541 is formed, as a protective insulating layer, in contact with the semiconductor layer including the channel formation region. The insulating layer 4541 can be formed using a material and a method which are similar to those of the protective insulating layer 107 described in Embodiment 1. Moreover, the insulating layer 4544 functioning as a planarization insulating layer covers the thin film transistor in order to reduce surface unevenness caused by the thin film transistor. Here, a silicon oxide layer is formed using a sputtering method in the similar manner to the protective insulating layer 107 described in Embodiment 1, as the insulating layer 4541.

Further, a protective insulating layer 4542 is formed over the insulating layer 4541. The protective insulating layer 4542 can be formed using a material and a method which are similar to those of the protective insulating layer 107 described in Embodiment 1. Here, a silicon nitride layer is deposited by a PCVD method as the protective insulating layer 4542.

The insulating layer 4544 is formed as the planarization insulating layer. The insulating layer 4544 may be formed using a material and a method which are similar to those of the insulating layer 4021 described in Embodiment 2. Here, an acrylic resin is used for the insulating layer 4544.

Moreover, reference numeral 4511 denotes a light-emitting element. A first electrode layer 4517 which is a pixel electrode included in a light-emitting element 4511 is electrically connected to a source electrode layer or a drain electrode layer of the thin film transistor 4510. Note that the structure of the light-emitting element 4511 is, but not limited to, a stacked structure which includes the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

Instead of the insulating layer 4544, a color filter layer may be provided. For performing full-color display, a light-emitting element 4511, one of adjacent light-emitting elements, and the other of the adjacent light-emitting elements are, for example, a green light-emitting element, a red light-emitting element, and a blue light-emitting element, respectively. Alternatively, a light-emitting display device capable of full color display may be manufactured using four kinds of light-emitting elements which include a white light-emitting element in addition to three kinds of light-emitting elements. A light-emitting display device capable of full color display may be manufactured in such a way that all of a plurality of light-emitting elements which is arranged is white light-emitting elements and a sealing substrate having a color filter or the like is arranged above the light-emitting element 4511. A material which exhibits a single color such as white is formed and combined with a color filter or a color conversion layer, whereby full color display can be performed. In addition, a display device in which a red light-emitting element, a blue light-emitting element, and a green light-emitting element are used in a pixel portion can be manufactured to perform full-color display. Needless to say, display with monochromatic light can also be performed. For example, a light-emitting display device may be formed, as a lighting device, using a white light-emitting element, or an area-color lighting device may be formed using a light-emitting element with another monochromatic color light-emission.

A partition 4520 is made of an organic resin layer, an inorganic insulating layer, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective layer may be formed over the second electrode layer 4513 and the partition 4520 in order to prevent oxygen, hydrogen, moisture, carbon dioxide, or the like from entering into the light-emitting element 4511. As the protective layer, a silicon nitride layer, a silicon nitride oxide layer, a DLC layer, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed from the same conductive layer as the first electrode layer 4517 included in the light-emitting element 4511, and a terminal electrode 4516 is formed from the same conductive layer as the source and drain electrode layers included in the thin film transistors 4509 and 4510. Accordingly, the terminal electrode 4516 is formed with a stack of a tin-mixed layer 4514 and a molybdenum layer.

The connection terminal electrode 4515 is electrically connected to a terminal included in the FPC 4518a with an anisotropic conductive layer 4519 therebetween.

The second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be provided as driver circuits formed using a single crystal semiconductor or a polycrystalline semiconductor over a substrate separately prepared. Alternatively, only the signal line driver circuits or part thereof, or only the scan line driver circuits or part thereof may be separately formed and mounted. This embodiment is not limited to the structure illustrated in FIGS. 6A and 6B.

Through the above steps a light-emitting display device (display panel) including a thin film transistor with high electric characteristics can be manufactured.

This embodiment can be implemented in combination with the structure described in Embodiment 1 as appropriate.

[Embodiment 5]

A semiconductor device disclosed in this specification can be applied to a variety of electronic appliances (including game machines). Examples of electronic devices include a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large game machine such as a pinball machine, a solar cell, and the like.

Figure 7A:
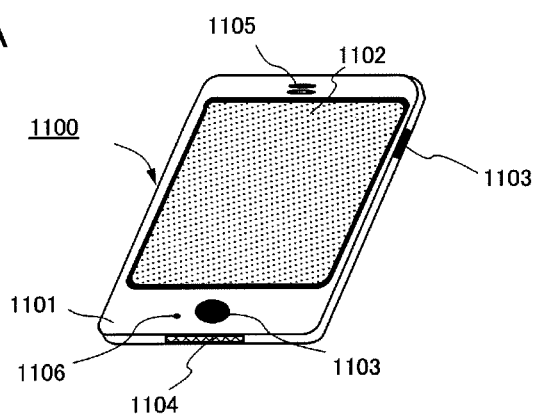
FIGS. 7A and 7B illustrate examples of an electronic apparatus.

FIG. 7A illustrates an example of a mobile phone handset. A mobile phone handset 1100 is provided with a display portion 1102 incorporated in a housing 1101, an operation button 1103, an external connection port 1104, a speaker 1105, a microphone 1106, and the like.

In the mobile phone handset 1100 illustrated in FIG. 7A, data can be input when by touching the display portion 1102 with a finger or the like. Further, operations such as making calls, composing mails, or the like can be performed by touching the display portion 1102 with a finger or the like.

There are mainly three screen modes of the display portion 1102. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1102 so that text displayed on a screen can be input. In that case, it is preferable to display a keyboard or number buttons on almost all area of the screen of the display portion 1102.

When a detection device including a sensor for detecting inclination, such as a gyroscope or an acceleration sensor, is provided inside the mobile phone handset 1100, display on the screen of the display portion 1102 can be automatically switched by determining the direction of the mobile phone handset 1100 (whether the mobile phone handset 1100 is placed horizontally or vertically for a landscape mode or a portrait mode).

The screen modes are switched by touching the display portion 1102 or operating the operation button 1103 of the housing 1101. Alternatively, the screen modes may be switched depending on the kind of the image displayed on the display portion 1102. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1102 is not performed for a certain period while a signal detected by the optical sensor in the display portion 1102 is detected, the screen mode may be controlled so as to be switched from the input mode to the display mode.

The display portion 1102 can also function as an image sensor. For example, an image of a palm print, a fingerprint, or the like is taken when the display portion 1102 is touched with a palm or a finger, whereby personal identification can be performed. Further, by providing a backlight or a sensing light source which emits a near-infrared light in the display portion, an image of a finger vein, a palm vein, or the like can be taken.

In the display portion 1102, the plurality of thin film transistors described in Embodiment 1 is arranged as switching elements of pixels.

Figure 7B:
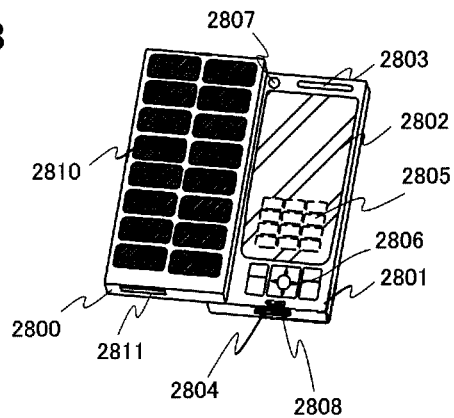

FIG. 7B is also an example of a portable information terminal. A portable information terminal one example of which is illustrated in FIG. 7B can have a plurality of functions. For example, in addition to a telephone function, such a portable information terminal can have a function of processing a variety of pieces of data by incorporating a computer.

The portable information terminal illustrated in FIG. 7B includes a housing 2800 and a housing 2801. The housing 2801 is provided with a display panel 2802, a speaker 2803, a microphone 2804, a pointing device 2806, a camera lens 2807, an external connection terminal 2808, and the like. In addition, the housing 2800 includes a solar cell 2810 having a function of charge of the portable information terminal, an external memory slot 2811, and the like. In addition, an antenna is incorporated in the housing 2801.

The display panel 2802 is provided with a touch panel. A plurality of operation keys 2805 which are displayed as images is illustrated by dashed lines in FIG. 7B.

Further, in addition to the above structure, a contactless IC chip, a small memory device, or the like may be incorporated.

The light-emitting device can be used for the display panel 2802 and the direction of display is changed appropriately depending on an application mode. Further, the light-emitting device is provided with the camera lens 2807 on the same surface as the display panel 2802, and thus it can be used as a video phone. The speaker 2803 and the microphone 2804 can be used for videophone calls, recording, and playing sound, etc. as well as voice calls. Moreover, the housings 2800 and 2801 in a state where they are developed as illustrated in FIG. 7B can be slid so that one is lapped over the other; therefore, the size of the portable information terminal can be reduced, which makes the portable information terminal suitable for being carried.

The external connection terminal 2808 can be connected to an AC adaptor and a variety of cables such as a USB cable, whereby charging and data communication with a personal computer or the like are possible. Moreover, a large amount of data can be stored by inserting a storage medium into the external memory slot 2811 and can be moved.

Further, in addition to the above functions, an infrared communication function, a television reception function, or the like may be provided.

Figure 8A:
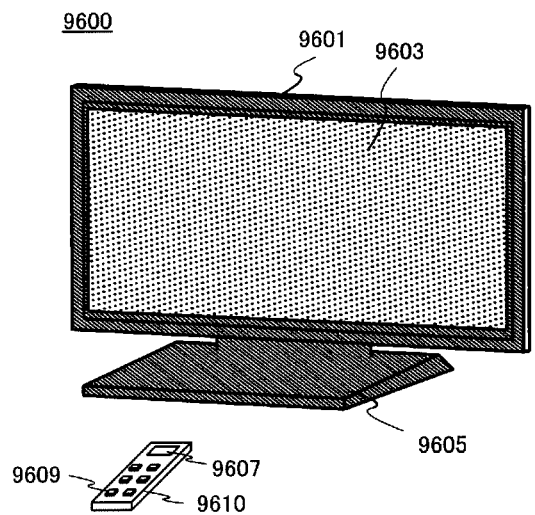
FIGS. 8A and 8B illustrate examples of an electronic apparatus.

FIG. 8A illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, a general television broadcast can be received. Moreover, when the television set is connected to a communication network with or without wires via the modem, one-way (from a sender to a receiver) or two-way (between a sender and a receiver or between receivers) information communication can be performed.

In the display portion 9603, the plurality of thin film transistors described in Embodiment 1 is arranged as switching elements of pixels.

Figure 8B:
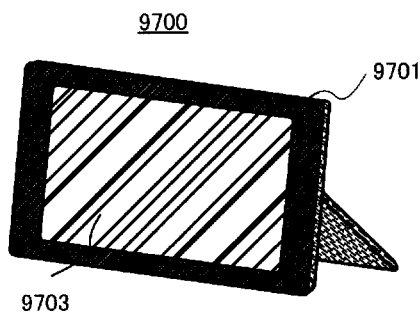

FIG. 8B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame.

In the display portion 9703, a plurality of the thin film transistors described in Embodiment 1 are arranged as switching elements of pixels.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 9:
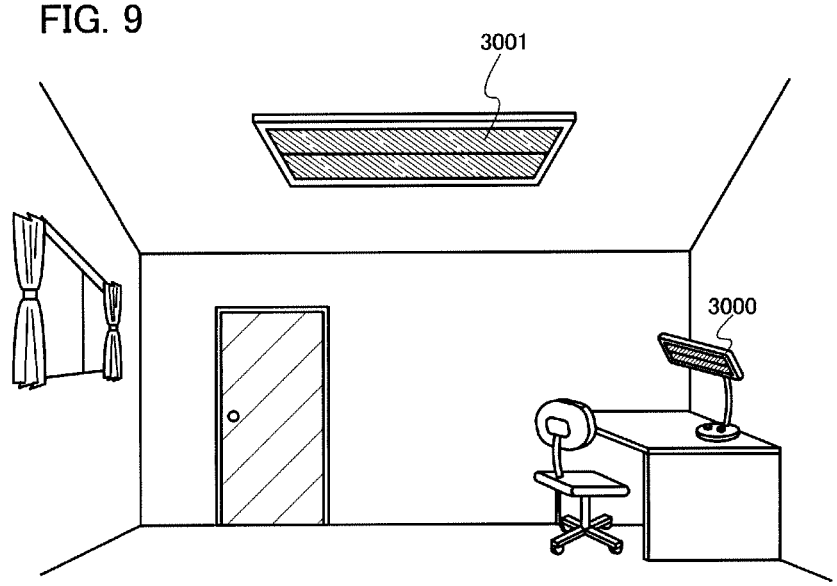
FIG. 9 illustrates an example of an electronic apparatus.

FIG. 9 is an example in which the light-emitting device formed in accordance with Embodiment 4 is used as an indoor lighting device 3001. Since the light-emitting device described in Embodiment 4 can be increased in area, the light-emitting device can be used as a lighting device having a large area. Further, the light-emitting device described in Embodiment 4 can be used as a desk lamp 3000. Note that a lighting device includes, in its category, a wall light, a light for an inside of a car, an evacuation light, and the like in addition to a ceiling light and a desk lamp.

As described above, the thin film transistor described in Embodiment 1 can be used for a variety of electronic appliances such as the above ones.

[Embodiment 6]

A semiconductor device disclosed in this specification can be applied to electronic paper. An electronic paper can be used for electronic appliances of a variety of fields as long as they can display data. For example, an electronic paper can be applied to an e-book reader (electronic book), a poster, an advertisement in a vehicle such as a train, or displays of various cards such as a credit card. Examples of the electronic devices are illustrated in FIG. 10.

Figure 10:
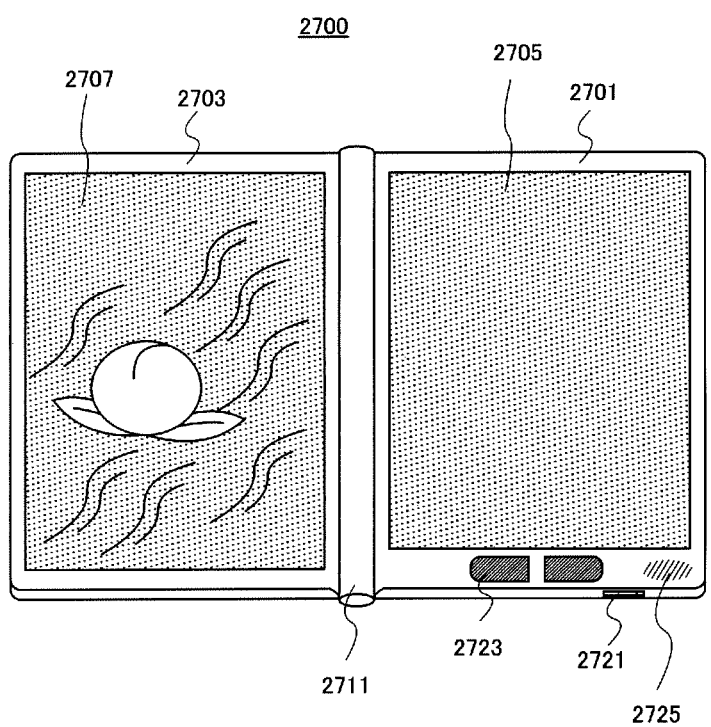
FIG. 10 illustrates an example of an electronic apparatus.

FIG. 10 illustrates an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 10) and graphics can be displayed on a display portion on the left side (the display portion 2707 in FIG. 10).

FIG. 10 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

This embodiment can be implemented by appropriately combining the thin film transistor described in Embodiment 1 and the electronic paper described in Embodiment 3.

This application is based on Japanese Patent Application serial no. 2009-235740 filed with Japan Patent Office on Oct. 9, 2009, the entire contents of which are hereby incorporated by reference.

The invention claimed is:

1. A semiconductor device comprising:
a substrate having an insulating surface;
a gate electrode layer over the substrate having the insulating surface;
a gate insulating layer over the gate electrode layer;
a source electrode layer and a drain electrode layer over the gate insulating layer; and
an oxide semiconductor layer over the source electrode layer and the drain electrode layer,
wherein the source electrode layer and the drain electrode layer are formed with a stack comprising a first metal layer and a second metal layer,
wherein the first metal layer and the second metal layer are in contact with the oxide semiconductor layer,
wherein the first metal layer is formed using a metal layer of a metal element selected from Se and Te, an alloy containing any of these elements as a component, or an alloy containing any of these elements in combination,
wherein the first metal layer is between the oxide semiconductor layer and the second metal layer,
wherein the second metal layer is between the first metal layer and the gate insulating layer,
wherein the second metal layer is formed using a metal layer of a metal element selected from Al, Ti, Mo, and W, an alloy containing any of these elements as a component, or an alloy containing any of these elements in combination,
wherein a first edge of the first metal layer is aligned with an edge of the oxide semiconductor layer, and
wherein the oxide semiconductor layer is not in contact with a top surface of the second metal layer.

2. The semiconductor device according to claim 1, wherein an entire portion of the oxide semiconductor layer overlaps with the gate electrode layer in a channel length direction.

3. The semiconductor device according to claim 1, wherein a second edge of the first metal layer is aligned with an edge of the second metal layer.

4. The semiconductor device according to claim 1, wherein the oxide semiconductor layer comprises indium, gallium, and zinc.

5. A method for manufacturing a semiconductor device, comprising the steps of:
- forming a gate electrode layer over a substrate having an insulating surface;
- forming a gate insulating layer over the gate electrode layer;
- forming a stack comprising a first metal layer and a second metal layer over the gate insulating layer;
- selectively etching the stack comprising the first metal layer and the second metal layer, so that a source electrode layer and a drain electrode layer having the stack are formed; and
- forming an oxide semiconductor layer over the source electrode layer and the drain electrode layer,
- selectively etching the oxide semiconductor layer and the first metal layer, so that a first edge of the first metal layer is aligned with an edge of the oxide semiconductor layer,
- wherein a metal element included in the first metal layer is at least one selected from Se and Te,
- wherein the first metal layer and the second metal layer are in contact with the oxide semiconductor layer,
- wherein the first metal layer is between the oxide semiconductor layer and the second metal layer,
- wherein the second metal layer is between the first metal layer and the gate insulating layer,
- wherein a metal element included in the second metal layer is at least one selected from Al, Ti, Mo, and W, and
- wherein the oxide semiconductor layer is not in contact with a top surface of the second metal layer.

6. The method for manufacturing the semiconductor device according to claim 5, wherein the metal element included in the first metal layer is other than a metal element included in the oxide semiconductor layer.

7. The method for manufacturing the semiconductor device according to claim 5, wherein an entire portion of the oxide semiconductor layer overlaps with the gate electrode layer in a channel length direction.

8. The method for manufacturing the semiconductor device according to claim 5, wherein a second edge of the first metal layer is aligned with an edge of the second metal layer.

9. The method for manufacturing the semiconductor device according to claim 5, wherein the oxide semiconductor layer comprises indium, gallium, and zinc.

10. A semiconductor device comprising:
- a substrate having an insulating surface;
- a gate electrode layer over the substrate having the insulating surface;
- a gate insulating layer over the gate electrode layer;
- a source electrode layer and a drain electrode layer over the gate insulating layer; and
- an oxide semiconductor layer over the source electrode layer and the drain electrode layer,
- wherein the source electrode layer and the drain electrode layer are formed with a stack comprising a first metal layer and a second metal layer,
- wherein the first metal layer and the second metal layer are in contact with the oxide semiconductor layer,
- wherein the first metal layer is formed using a metal layer of a metal element selected from Se and Te, an alloy containing any of these elements as a component, or an alloy containing any of these elements in combination,
- wherein the metal element included in the first metal layer is different from a metal element included in the oxide semiconductor layer,
- wherein the first metal layer is between the oxide semiconductor layer and the second metal layer,
- wherein the second metal layer is between the first metal layer and the gate insulating layer,
- wherein the second metal layer is formed using a metal layer of an element selected from Al, Ti, Mo, and W, an alloy containing any of these elements as a component, or an alloy containing any of these elements in combination,
- wherein a first edge of the first metal layer is aligned with an edge of the oxide semiconductor layer, and
- wherein the oxide semiconductor layer is not in contact with a top surface of the second metal layer.

11. The semiconductor device according to claim 10, wherein an entire portion of the oxide semiconductor layer overlaps with the gate electrode layer in a channel length direction.

12. The semiconductor device according to claim 10, wherein a second edge of the first metal layer is aligned with an edge of the second metal layer.

13. The semiconductor device according to claim 10, wherein the oxide semiconductor layer comprises indium, gallium, and zinc.

* * * * *